United States Patent [19]

Van de Wiel et al.

[11] Patent Number: 4,717,944
[45] Date of Patent: Jan. 5, 1988

[54] SEMICONDUCTOR DEVICE HAVING A FIELD EFFECT TRANSISTOR WITH IMPROVED LINEARITY

[75] Inventors: Petrus J. A. M. Van de Wiel; Leonard J. M. Esser, both of Eindhoven, Netherlands

[73] Assignee: U.S. Philips Corporation, New York, N.Y.

[21] Appl. No.: 922,791

[22] Filed: Oct. 23, 1986

Related U.S. Application Data

[63] Continuation of Ser. No. 668,236, Nov. 5, 1984, abandoned.

[30] Foreign Application Priority Data

Nov. 8, 1983 [NL] Netherlands ............................ 8303834

[51] Int. Cl.$^4$ ............................................. H01L 29/78
[52] U.S. Cl. .............................. 357/23.14; 357/23.12; 357/23.3; 357/23.1; 357/41
[58] Field of Search ................. 357/23.14, 23.12, 23.3, 357/23.1, 41

[56] References Cited

U.S. PATENT DOCUMENTS

| | | | |
|---|---|---|---|
| 3,374,407 | 3/1968 | Olmstead | 357/23.12 |
| 3,745,426 | 7/1973 | Olmstead | 357/23.12 |
| 3,969,745 | 7/1976 | Blocker, III | 357/23.14 X |
| 4,219,828 | 8/1980 | Lardy et al. | 357/23.14 X |
| 4,344,080 | 8/1982 | Tihanyi | 357/41 |

FOREIGN PATENT DOCUMENTS 55-86163  6/1980  Japan .............................. 357/23.12

OTHER PUBLICATIONS

Rodgers et al., "An Expand Theoretical Analysis of Double-Diffused Mos Transistors," *IEEE J. of Solid State Circuits*, vol. 5C-10, No. 5, 10/75, pp. 322-330.
Barsan, "Analysis and Modeling of Dual-Gate MOSFET's", *IEEE Trans. on Elec. Dev.*, vol. Ed.-28, No. 5, May 1981, pp. 523-534.

*Primary Examiner*—Andrew J. James
*Assistant Examiner*—William A. Mintel
*Attorney, Agent, or Firm*—Robert T. Mayer; Steven R. Biren

[57] ABSTRACT

A semiconductor device including a field effect transistor, such as an insulated gate field effect transistor, which has in the direction from source zone to drain zone successive first and second channel zones with associated gate electrode parts. According to the invention, over at least 80% of the overall channel width, in a direction at right angles to the direction of source-drain current, the ratio $L_1/L_2$ between the length $L_1$ of the first gate electrode part and the length $L_2$ of the second gate electrode part is variable and smaller than unity in order to improve the linearity of the field effect transistor.

8 Claims, 11 Drawing Figures

SEMICONDUCTOR DEVICE HAVING A FIELD EFFECT TRANSISTOR WITH IMPROVED LINEARITY

This is a continuation of application Ser. No. 668,236, filed Nov. 5, 1984, now abandoned.

BACKGROUND OF THE INVENTION

The invention relates to a semiconductor device having a semiconductor body including at least one field effect transistor having surface-adjoining source and drain zones and a channel region which is bounded by the source and drain zones and adjoins the surface and which has a first channel zone adjoining the source zone and a second channel zone adjoining the drain zone, a first gate electrode part extending from the source zone above the first channel zone, and a second gate electrode part extending above the second channel zone as far as the drain zone, the first and second gate electrode parts together covering substantially the whole channel region and being separated from the channel region by a blocking layer.

The blocking layer may be constituted by a layer of electrically insulating material, by a rectifying metal/semiconductor junction ("Schottky" junction) or by a pn junction, as far as these junctions are normally connected in the reverse direction. In the two last-mentioned cases, the designations "MESFET" (Metal Schottky Field Effect Transistor) are used.

A semiconductor device of the kind described is known from the article of Rodgers et al in I.E.E.E. journal of Solid State Circuits, Volume SC 10, October 1975, p. 322-331. This article describes a field effect transistor of the so-called D-MOST type. The first channel zone is then constituted by the laterally diffused channel zone adjoining the source zone and the second channel zone is constituted by the part of the substrate located between the first channel zone and the drain zone (the "drift region"). The first and second gate electrode parts constitute one coherent gate electrode.

Another example of such a device is a field effect transistor having two separated insulated gate electrodes, as described in the article of Barsain in I.E.E.E. Transactions on Electron Devices, Volume ED 28, May 1981 p. 523-534.

Insulated gate field effect transistors are generally designated by the abbreviation "MOST" (Metal Oxide-Semiconductor Transistor) or more correctly and more generally by the abbreviation "IGFET" (Insulated Gate Field Effect Transistor). These abbreviations will also be used in the present application.

When using field effect transistors, a very important property is the so-called linearity of the transistor, that is to say the extent to which the mutual conductance $$g_m = \frac{(\partial I_D)}{\partial V_g} V_{DS}$$

(where $I_D$ is the drain current, $V_g$ is the effective gate electrode voltage and $V_{DS}$ is the voltage between source and drain zone) is constant with varying gate voltage. In addition to satisfactory high-frequency behavior and high mutual conductance, good linearity is most desirable.

In this application the term "effective gate voltage $V_g$" is to be understood to mean the actual voltage at the first gate electrode part with respect to the source zone minus the threshold voltage with respect to the first channel zone.

It is known that a field effect transistor has better linearity as the channel is made shorter, in order to obtain the desired linearity in combination with favorable high-frequency properties and a high mutual conductance, however, a very short channel of at most 1 um is required. Under given circumstances, this may give rise to technological problems.

In a field effect transistor having two insulated gates of the ordinary type, as described in the last-mentioned publication, the mutual conductance as a function of the effective gate voltage $V_{g1}$ at the first gate electrode (with constant drain voltage and a constant voltage difference between the gate electrodes) has a maximum value at a given limit value $V_{gm}$ of the gate voltage $V_{g1}$. With a further increase of the gate voltage, the mutual conductance decreases and then slowly increases again, as can be seen in FIG. 14 of the publication in I.E.E.E. Trans. El. Dev., ED 28, p. 523-534. The limit value $V_{gm}$ is determined inter alia by the ratio $L_1/L_2$ between the lengths $L_1$ and $L_2$ of the first and second gate electrode parts, respectively, in this case the separated gate electrodes.

The same form of $g_m$-$V_g$ characteristic is also obtained with a so-called D-MOS transistor as described in the first-mentioned publication in the I.E.E.E. Journal of Solid State Circuits, SC 10 (1975), p. 322-330, in which both the source zone and a first highly doped channel zone of the opposite conductivity type are formed by doping via the same mask opening. The length of the first channel zone is then determined by the difference in lateral diffusion of the two dopants and the second channel zone (the "drift region") is constituted by a part of the semiconductor layer, in which the first channel zone and the source and drain zones are provided. Such a D-MOST can be considered as a MOS transistor having two consecutively arranged and interconnected gate electrodes, one above each channel zone, which have different threshold voltages due to the difference in surface doping of the two channel zones.

The "peak" in the $g_m$-$V_g$ characteristic occurring in the above cases forms a generally undesirable irregularity, which limits the part of the characteristic in which the linearity is sufficiently high.

SUMMARY OF THE INVENTION

The present invention has inter alia for its object to reduce the said irregularity in the $g_m$-$V_g$ characteristic and to enlarge the substantially linear part of the characteristic.

The invention is based inter alia on the recognition of the fact that this object can be achieved by providing the two gate electrodes with a suitable form.

According to the invention, a semiconductor device of the kind described above is therefore characterized in that over at least 80% of the total channel width in a direction at right angles to the direction of source-drain current the ratio $L_1/L_2$ between the length $L_1$ of the first gate electrode part and the length $L_2$ of the second gate electrode part varies and is smaller than unity.

The field effect transistor according to the invention can be considered as a parallel arrangement of a larger number of field effect transistors which each have two gate electrodes, but different $L_1/L_2$ ratios. The $g_m$-$V_g$ characteristics thereof are the sum of the characteristics of the parallel-connected subtransistors, which each have peaks as described above, each peak occurring at a different value of the gate voltage. Thus, there is a range for $V_g$ in which the failing characteristics compensate for the rising characteristics and there is obtained a resulting characteristic with a much larger range of substantially constant mutual conductance $g_m$ than with a transistor having a single constant $L_1/L_2$ ratio, as will be explained more fully hereinafter.

The part of the channel width over which the ratio $L_1/L_2$ is not smaller than unity, if present, generally does not or substantially does not contribute to an increase in linearity. According to a preferred embodiment this part therefore has a length of zero so that the ratio $L_1/L_2$ varies over the whole channel width. In this case, the whole channel width provides a positive contribution to the increase in linearity.

One or both of the lengths $L_1$ and $L_2$ of the two gate electrode parts can vary in order to obtain the desired variation of $L_1/L_2$. According to a preferred embodiment, only the length $L_1$ has a substantially constant small value throughout the area. This case arises, for example, with a D-MOS transistor in which the first gate electrode part is situated above the laterally diffused channel zone of the D-MOS transistor, which has the same length throughout its area, this first gate electrode part constituting together with the second gate electrode part connected thereto the gate electrode of the D-MOS transistor.

According to another preferred embodiment, the two gate electrode parts are constituted by the two separated gate electrode parts of a tetrode insulated gate field effect transistor.

The variation of the ratio $L_1/L_2$ can be obtained in different ways. For example, one or more maxima and/or minima may occur in the value of $L_1/L_2$ over a distance within which $L_1/L_2$ varies. However, the ratio $L_1/L_2$ advantageously varies monotonously in a direction at right angles to the direction of source-drain current.

It should further be noted that the lengths of the first and second gate electrode parts may vary either continuously or stepwise, in the latter case the number of steps being preferably chosen so as to be as large as possible, which corresponds to the parallel arrangement of the largest possible number of field effect transistors having different $L_1/L_2$ rotations. The larger the number of parallel-connected transistors, the closer is the approximation of a perfect linearity. A continuous variation of the $L_1/L_2$ ratio is therefore the optimum solution, but, for example, with mask drawings produced by a computer, stepped lines are generally inevitable.

BRIEF DESCRIPTION OF THE DRAWING

The invention will now be described more fully with reference to several embodiments and the drawing, in which.

The figures are schematic and not drawn to scale. Corresponding parts are generally designated by the same reference numerals.

DESCRIPTION OF THE PREFERRED EMBODIMENTS

Figure 1:
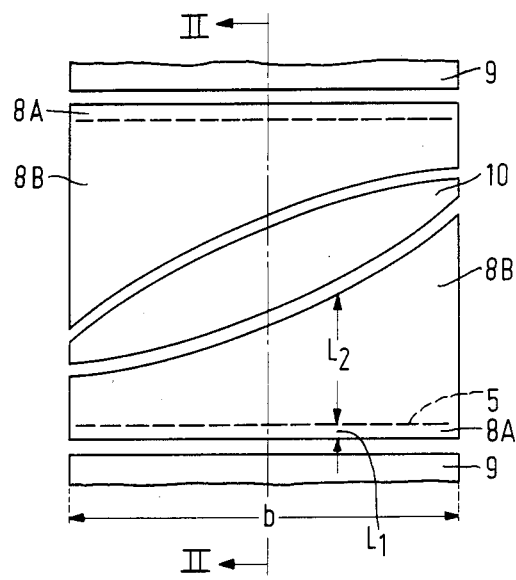
FIG. 1 is a plan view of a part of a semiconductor device according to the invention.
Figure 2:
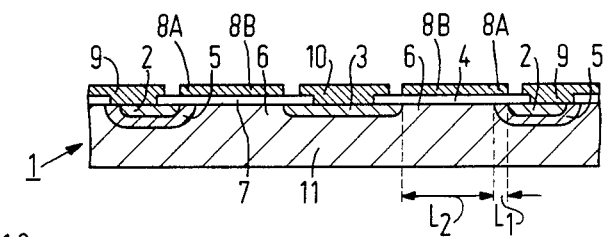
FIG. 2 shows diagrammatically a cross-section of the device shown in FIG. 1 taken on the line II—II.

FIG. 1 shows in plan view and FIG. 2 shows diagrammatically in cross-section (taken on the line II—II in FIG. 1) a semiconductor device according to the invention having a semiconductor body 1, in this example of silicon. The semiconductor body comprises an insulated gate field effect transistor. The field effect transistor (in this example of double construction) has a source zone 2 composed of two parts and a drain zone 3, which are constituted in this example by n-type conducting semiconductor zones which adjoin a surface 4 of the semconductor body 1. Furthermore, the field effect transistor has a channel region, which is bounded by the source and drain zones (2,3), adjoins the surface 4 and consists of a first channel zone 5 adjoining the source zone 2 and a second channel zone 6 adjoining the drain zone 3, which in this example each also consist of two parts which are both p-type conducting. The second channel zone 6 forms a part of the homogeneously doped substrate region 11, which in turn may be part of, for example, an epitaxial layer grown onto a supporting body. The field effect transistor described here is of the D-MOST type, in which the n-type source zone 2 and the p-type first channel zone 5 are both provided via the same doping mask. There is disposed on the channel region (5, 6) an insulating layer 7, in this example of silicon oxide, on which is disposed a gate electrode 8A,B. The latter consists, on either side of the drain zones, of a first gate electrode part 8A, which extends from the source zone 2 above the first channel zone 5, and a second gate electrode part 8B, which extends above the second channel zone 6 as far as the drain zone 3. The first and second gate electrode parts 8A and 8B are interconnected in this example; they constitute together the gate electrode 8 of the D-MOS transistor which covers the whole channel region (5,6). The source and drain zones 2,3 are provided with source and drain electrodes 9 and 10. The source electrode 9 also contacts the channel zone 5.

In known D-MOS transistors of the kind described above, the length of each of the two parts 8A and 8B of the gate electrode 8, that is to say their dimension in the direction from source to drain zone, is equally large throughout their area. The mutual conductance $g_m$ varies in these known transistors in dependence upon the effective gate voltage $v_g$ and has a maximum value at a given value of $V_g$, as described above.

According to the invention, however, over at least 80% of the total channel width b, the ratio $L_1/L_2$ between the length $L_1$ of the first gate electrode part 8A and the length $L_2$ of the second gate electrode part 8B varies, while $L_1/L_2 < 1$ (see FIG. 1). In this example, $L_1$, the length of the first gate electrode part 8A, which is situated above the diffused channel zone 5, is of course equally large throughout the area, while the length $L_2$ of the second gate electrode part 8B varies monotonously in a direction at right angles to the direction of source-drain current so that the ratio $L_1/L_2$ also varies uniformly.

Figure 3:
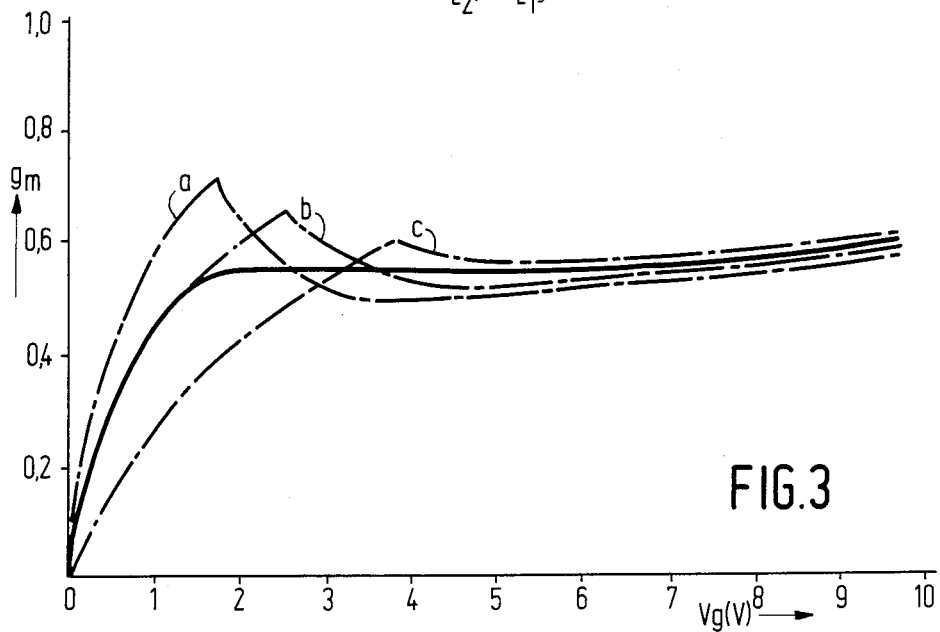
FIG. 3 shows diagrammatically the formation of the $g_m$-$V_g$ characteristic from subcharacteristics of the form a, b, c.

In FIG. 3, the full line indicates the variation of the value of $g_m$ (normalized on the theoretical limit value for very large values of $V_g$) in dependence upon $V_g$ for the slightly simplified case of a D-MOST with a variable $L_1/L_2$ in which the variation is not continuous, as in FIG. 1, but is effected in 8 steps, which consequently corresponds to 8 parallel-connected D-MOS transistors having the following values of $L_1$ and $L_2$:

| $L_1$ (μm) | 0.50 | 0.50 | 0.50 | 0.50 | 0.50 | 0.50 | 0.50 | 0.50 |
|---|---|---|---|---|---|---|---|---|
| $L_2$ (μm) | 1.50 | 2.00 | 2.50 | 3.00 | 4.00 | 5.00 | 6.00 | 8.00 |
| $L_1/L_2$ | 0.33 | 0.25 | 0.20 | 0.17 | 0.13 | 0.10 | 0.08 | 0.06 |

The resulting curve is substantially linear over a large range for gate voltages above about 2 V. It has been formed from the constituent $g_m$-$V_g$ characteristics of the 8 parallel connected transistors. Three of these characteristics (a, b and c) are shown diagrammatically in FIG. 3. These characteristics are associated respectively with the smallest, about the intermediate and the largest value of $L_1/L_2$. FIG. 3 clearly illustrates the improvement with respect to each of the constituent characteristics taken separately.

The fact that in general only the parts of the transistor for which $L_2 > L_1$ provide a substantial contribution to the improvement of the linearity can be explained as follows (see FIG. 4).

Figure 4:
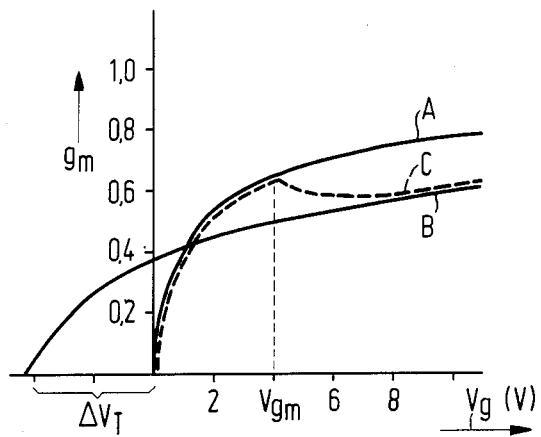
FIG. 4 shows the formation of these subcharacteristics.

In FIG. 4, as in FIG. 3, the effective gate voltage $V_g$ is plotted in the horizontal direction and the (normalized) mutual conductance $g_m$ is plotted in the vertical direction. The broken line indicates the $g_m$-$V_g$ characteristic for a D-MOS transistor having a fixed value of $L_1/L_2$. This characteristic is the resultant of two sub-characteristics i.e. the full line A which represents the behavior of a single MOST having a channel equal to the first channel zone and the full line B which represents the behavior of a single MOST having a channel equal to the total (first plus second) channel zone. The characteristics A and B are displaced with respect to each other over a distance $\Delta V_T$, which indicates the difference of the threshold voltages of the first and second channel zones (due to the difference in surface doping).

The resultant of the characteristics A and B is the characteristic C with a transition from a rising to a falling part at $V_{gm}$. At gate voltages lower than $V_{gm}$, both the first and the second channel zone are pinched off (for a sufficiently high drain voltage and they operate in the so-called pentode range so that the behavior of the transistor is fully determined by the first channel zone, which can convey only a limited current. For gate voltages larger than $V_{gm}$, the first channel zone operates in the "triode range", while the second channel zone is still pinched off. The behavior of the whole transistor is now determined by the two channel zones (characteristic B). The resulting characteristic C corresponds to any one of the curves a, b and c of FIG. 3.

The larger the difference between the subcharacteristics A and B, the smaller $V_{gm}$ becomes and the "peak" in the characteristic C accordingly becomes more strongly pronounced. The difference between A and B becomes larger as the first channel zone becomes larger with respect to the total channel zones.

When the length of the first channel zone becomes too large and amounts to more than half the total channel zone, or in other words becomes equal to or larger than that of the second channel zone, the difference between the characteristics A and B becomes so small that substantially no "peak" occurs in the resulting characteristic C. In order to utilize to full advantage the construction of falling and rising parts of the characteristics, such as a, b and c in FIG. 3, the length of the (controlled) first channel zone, i.e. the length $L_1$ of the first gate electrode part, consequently has to be smaller than the length of the (controlled) second channel zone, i.e. the length $L_2$ of the second gate electrode part.

In the example of FIGS. 1 and 2, the total channel width b of the transistor described was 200/μm, while the substrate 11 consisted of p-type silicon having a resistivity of about 30Ω·cm. The channel zones 5 had an average doping concentration of about $5 \times 10^{16}$ atoms/cm$^3$, while the source and drain zones (2,3) had an average doping of about $10^{20}$ atoms/cm$^3$. The thickness of the oxide layer 7 under the gate electrode 8 was about 50 nm. The gate electrode consisted in this example of highly doped polycrystalline silicon, but it may also consist of metal, for example of aluminum.

Figure 5:
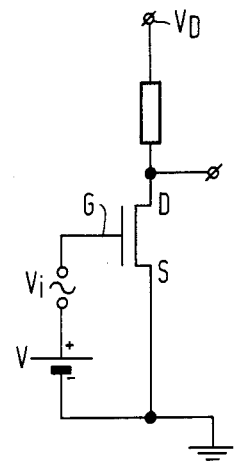
FIG. 5 shows a circuit diagram of the device shown in FIG. 1 and FIG. 2.

The transistor is connected during operation in the manner shown, for example, in the circuit diagram of FIG. 5. The input signal $V_i$ is superimposed on a direct voltage V; the drain voltage $V_D$ may have, for example, a value of 20 V and the output signal $V_u$ is derived from the drain electrode D.

Figure 6:
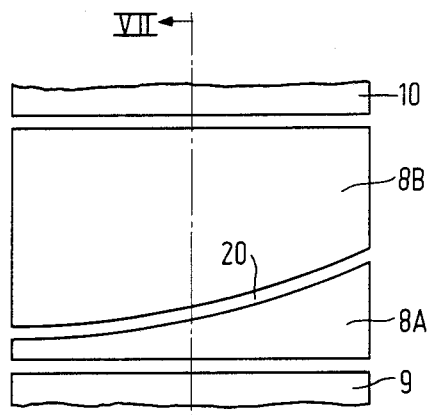
FIG. 6 is a plan view of another device according to the invention.
Figure 7:
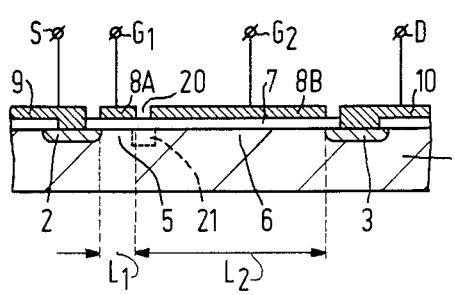
FIG. 7 shows diagrammatically a cross-section of the device shown in FIG. 6 taken on the line VII—VII.

Instead of in a D-MOS transistor, the invention may also be used in a tetrode field effect transistor having two separated gate electrodes. Such a transistor is shown in FIG. 6 in plan view and in FIG. 7 diagrammatically in cross-section (taken on the line VII—VII in FIG. 6). This field effect transistor has two gate electrodes 8A and 8B having lengths of $L_1$ and $L_2$, respectively, of which the ratio $L_1/L_2$ varies uniformly over the whole channel width in a direction at right angles to the direction of the current from source zone 2 to drain zone 3. The gate electrodes are mutually separated by a narrow gap 20, which has to be so narrow that a continuous current channel can be induced from the source zone 2 to the drain zone 3. The transistor shown here is an enhancement mode transistor having n-type source and drain zones and a p-type channel region (5,6). Corresponding parts in FIGS. 1, 2, 6 and 7 have the same reference numerals. The doping concentration of the substrate 11 (which may also be, for example, an epitaxial layer) and of the source and drain zones 2 and 3 as well as the thickness of the oxide layer 7 may be the same as in the example of FIGS. 1 and 2. In order to guarantee a continuous current channel between the source zone and the drain zone, if desired, a narrow n-type "island" 21 (dotted line in FIG. 7) may be formed under the gap 20 or the gate electrodes may overlap each other in part.

Figure 8:
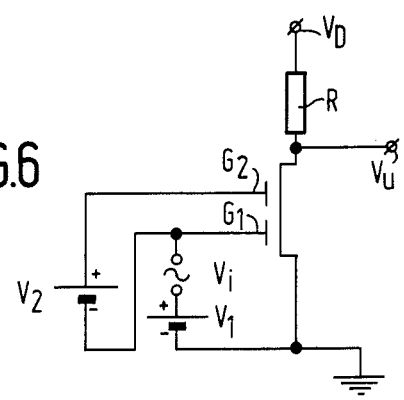
FIG. 8 shows a circuit diagram of the device shown in FIG. 6 and FIG. 7.

The transistor of FIGS. 6 and 7 can be connected according to the circuit diagram of FIG. 8. The (direct) bias voltages of the gate electrode connections $G_1$ and $G_2$ are $V_1$ and $V_1 + V_2$, respectively; the input signal $V_i$ is applied to the two gate electrodes parts 8A and 8B. By variation of the voltages $V_1$ and $V_2$, the form of the $g_m$-$V_g$ characteristics associated with the parallel-connected subtransistors, in which the whole tetrode MOS transistor can be assumed to be subdivided, can be varied within given limits. Thus, an optimum linearity can be attained and a resulting $g_m$-$V_g$ characteristic analogous to that of FIG. 3 can be obtained.

Figure 9:
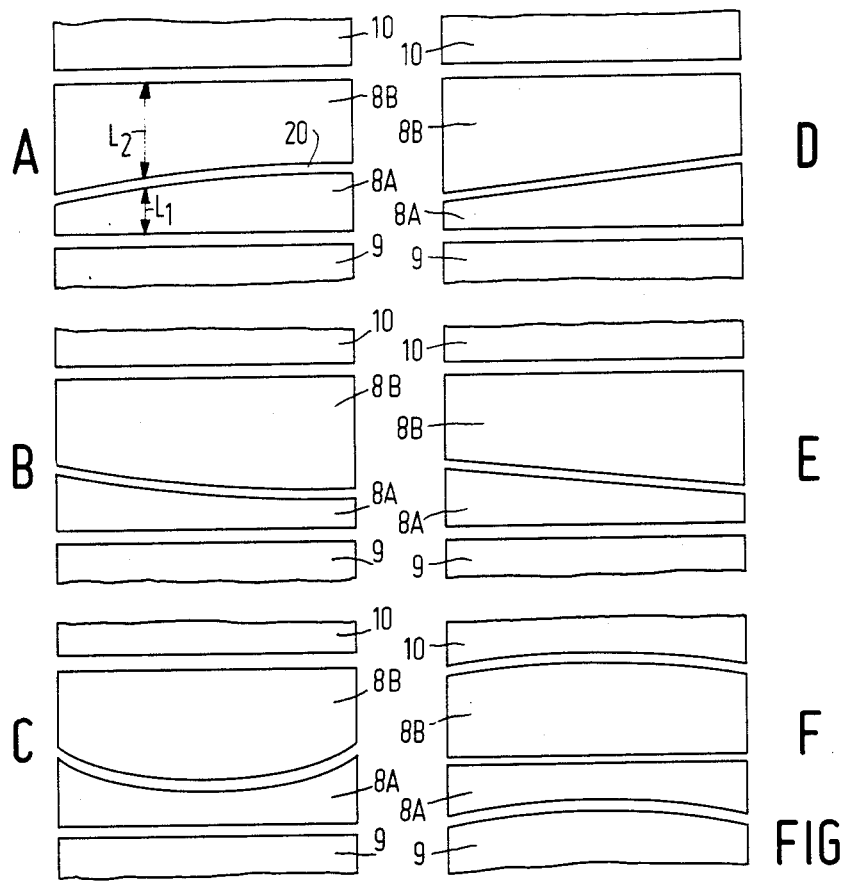
FIG. 9 is shows in plan view various modifications of the device according to the invention.

With the transistor type described above, the ratio $L_1/L_2$ varied in both cases monotonously, viewed in a direction at right angles to the direction of source-drain current. This is not necessary, however, and, dependent upon the circumstances, various modifications of the $L_1/L_2$ variation may be used. Some of these modifications are shown in plan view in FIGS. 9A to F, which all relate to a tetrode MOS transistor having two separated gate electrodes. Especially the $L_1/L_2$ ratio may, instead of varying monotonously, vary via an extremum, for example via a minimum, as in FIGS. 9C and F. Alternatively, the $L_1/L_2$ variation may be linear, as shown in FIG. 9D or E. There are still other possibilities. Furthermore, it is possible that $L_1/L_2$ does not, as in the examples disclosed hitherto, vary and be smaller than unity over the whole width. If necessary, $L_1/L_2$ may be larger than unity and/or constant over a part (at most 20%) of the channel width. As stated above, however, the linearity is optimum when the condition "$L_1/L_2 < 1$ and variable" holds for the whole channel width.

Figure 10:
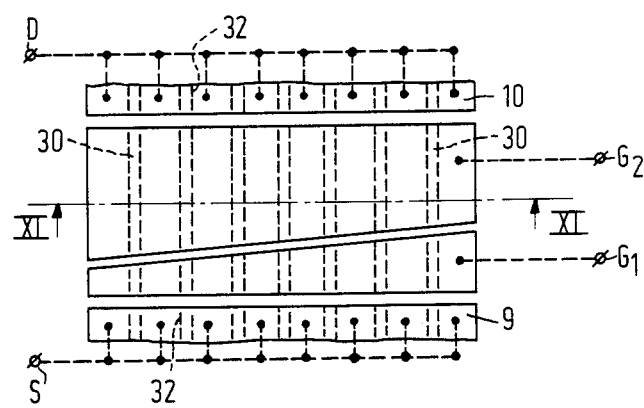
FIG. 10 is a plan view of a further device according to the invention.
Figure 11:
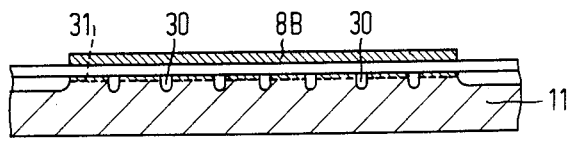
FIG. 11 shows diagrammatically a cross-section of the device shown in FIG. 10 taken on the line XI—XI.

In the examples described hitherto, the channel zones are coherent in a direction at right angles to the direction of source-drain current. This is not necessary and under given circumstances it may be advantageous to subdivide the current channel by means of separation zones into a number of parallel-extending separated strips. FIG. 10 shows in plan view and FIG. 11 shows diagrammatically in cross-section on the line XI—XI a field effect transistor of the type of FIGS. 6 and 7, in which, however, the n-type current channel 31 induced in the p-type substrate 11 consists of strips which are separated from each other by separation strips 30, which in this example are oxide strips, but may also be formed in a different manner. Each of the said strips has a given ratio $L_1/L_2$, which is different for each individual strip, while the first gate electrode parts and also the second gate electrode parts are all electrically interconnected.

Finally, the source and drain zones may also be subdivided into sub-source zones and sub-drain zones electrically separated from each other and associated with the strips, both the sub-source zones and the sub-drain zones being electrically interconnected. This is indicated by dotted lines in FIG. 10. The device then consists in fact of parallel-connected field effect transistors, whose $L_1/L_2$ ratios are different and whose corresponding electrodes are interconnected.

The invention is not limited to the embodiments described. For example, the gate electrodes may consist either of a metal or a different conductive material, for example a silicon, or a metal silicide. The gate electrodes may be separated from the channel region by an insulating material other than silicon oxide, for example by silicon nitride, or by a Schottky junction or by a p-n junction. Furthermore, the semiconductor material of the device may instead of silicon consist of another semiconductor element or of a semiconductor compound. If the device is an insulated gate field effect transistor, it may be of the depletion type instead of the enhancement type and may comprises for this purpose, for example, an implanted n- or p-type surface layer.

We claim:

1. A semiconductor device having a semiconductor body comprising at least one field effect transistor having surface-adjoining source and drain zones and a channel region bounded by the source and drain zones, adjoining the surface and comprising a first channel zone adjoining the source zone and a second channel zone adjoining the drain zone, an insulating layer on said channel region, a first gate electrode part on said insulating layer and extending from the source zone above the first channel zone, and a separate second gate electrode part on said insulating layer, electrically isolated from said first gate electrode part and extending above the second channel zone as far as the drain zone, the first and second gate electrode parts together covering substantially the whole channel region, the ratio $L_1/L_2$ between the length $L_1$ of the first gate electrode part and the length $L_2$ of the second gate electrode part being variable and less than unity over at least 80% of the total channel width in a direction at right angles to the direction of the source-drain current.

2. A semiconductor device as claimed in claim 1, characterized in that the ratio $L_1/L_2$ varies and is smaller than unity over the whole channel width.

3. A semiconductor device as claimed in claim 1 or 2, characterized in that the length $L_1$ of the first gate electrode part is substantially constant.

4. A semiconductor device as claimed in claim 3, wherein said field effect transistor comprises a D-MOS transistor, wherein said source zone is provided within said first channel zone, characterized in that the first gate electrode part is situated above the first channel zone and said D-MOS transistor and comprises together with the second gate electrode part connected thereto the gate electrode of the D-MOS transistor.

5. A semiconductor device as claimed in claim 1 or 2, wherein said source zone is provided directly in said semiconductor body, characterized in that the first and second gate electrode parts comprise the first and second gate electrodes of a tetrode insulated gate field effect transistor.

6. A semiconductor device as claimed in claim 1 or 2, characterized in that the ratio $L_1/L_2$ varies uniformly in a direction at right angles to the direction of the source-drain current.

7. A semiconductor device as claimed in claim 1 or 2, characterized in that at least the channel region is subdivided into a plurality of parallel strips electrically separated from each other and extending from the source zone to the drain zone, each strip having its associated first and second gate electrode parts and a selected ratio $L_1/L_2$ between said parts, which selected ratio is different for each individual strip, every first gate electrode part being electrically interconnected and every second gate electrode part being electrically interconnected.

8. A semiconductor device as claimed in claim 7, characterized in that the source and drain zones are also subdivided into subzones separated from each other and associated with the strips, the sub-source zones being externally electrically interconnected and the sub-drain zones being externally electrically interconnected.

* * * * *